(12) United States Patent
Vos et al.

(10) Patent No.: US 8,995,694 B2
(45) Date of Patent: Mar. 31, 2015

(54) EMBEDDED CIRCUIT IN A MEMS DEVICE

(71) Applicant: Knowles Electronics, LLC, Itasca, IL (US)

(72) Inventors: Sandra F. Vos, East Dundee, IL (US); Daniel Giesecke, West Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 13/755,417

(22) Filed: Jan. 31, 2013

(65) Prior Publication Data

US 2013/0193533 A1 Aug. 1, 2013

Related U.S. Application Data

(60) Provisional application No. 61/706,350, filed on Sep. 27, 2012, provisional application No. 61/593,611, filed on Feb. 1, 2012.

(51) Int. Cl.
*H04R 25/00* (2006.01)
*B81B 3/00* (2006.01)
(Continued)

(52) U.S. Cl.
CPC .............. *B81B 3/0064* (2013.01); *B81C 1/0023*
(Continued)

(58) Field of Classification Search
CPC ........ H04R 19/005; H04R 19/04; H04R 3/00; H04R 3/005; H04R 1/04; H04R 2499/11; H04R 2201/003; H04R 17/02; H04R 5/04; B81B 2201/0257; B81B 7/008; H01L 2224/48227

USPC ......... 381/174, 150, 355, 333, 306, 388, 334, 381/361, 365, 175, 374; 29/594, 609.1; 257/416, 704, 723, 724, 731, 774, 782
See application file for complete search history.

(56) References Cited

U.S. PATENT DOCUMENTS

| 2002/0020898 A1* | 2/2002 | Vu et al. ................. 257/676 |
| 2007/0205492 A1 | 9/2007 | Wang |
| 2011/0121413 A1 | 5/2011 | Allen et al. |

(Continued)

FOREIGN PATENT DOCUMENTS

| KR | 10-2012-0005768 A | 1/2012 |
| WO | 2011076910 | 6/2011 |

OTHER PUBLICATIONS

International Search Report and Written Opinion for PCT/US2013/061873, dated Jan. 28, 2014, 9 pages.

*Primary Examiner* — Curtis Kuntz
*Assistant Examiner* — Sunita Joshi
(74) *Attorney, Agent, or Firm* — Fitch, Even, Tabin & Flannery LLP

(57) ABSTRACT

A Microelectromechanical System (MEMS) microphone includes a printed circuit board, a MEMS die, and an integrated circuit. The MEMS die is disposed on a top surface of the printed circuit board. The integrated circuit is disposed at least partially within the printed circuit board and produces at least one output signal. The output signals of the integrated circuit are routed directly into at least one conductor to access pads at the printed circuit board and the access pads are disposed on a bottom surface of the printed circuit board that is opposite the top surface.

10 Claims, 6 Drawing Sheets

(51) Int. Cl.
  *B81C 1/00* (2006.01)
  *H04R 19/00* (2006.01)
  *H04R 31/00* (2006.01)
  *H01L 29/84* (2006.01)
(52) U.S. Cl.
  CPC ................ (2013.01); *H04R 19/005* (2013.01)
  USPC .............................. 381/174; 257/416; 29/594

(56) References Cited

U.S. PATENT DOCUMENTS

2011/0186943 A1 8/2011 Pahl et al.
2011/0187227 A1 8/2011 Chen et al.
2012/0087521 A1* 4/2012 Delaus et al. ................. 381/174

* cited by examiner

EMBEDDED CIRCUIT IN A MEMS DEVICE

CROSS REFERENCES TO RELATED APPLICATIONS

This patent claims benefit under 35 U.S.C. §119 (e) to U.S. Provisional Application No. 61/593,611 entitled "Embedded Circuit In A MEMS Device" filed Feb. 1, 2012, the content of which is incorporated herein by reference in its entirety.

This patent also claims benefit under 35 U.S.C. §119 (e) to U.S. Provisional Application No. 61/706,350 entitled "Embedded Circuit In A MEMS Device" filed Sep. 27, 2012, the content of which is incorporated herein by reference in its entirety.

TECHNICAL FIELD

This application relates to acoustic devices and, more specifically, to the disposition of integrated circuits at or within these devices.

BACKGROUND OF THE INVENTION

MicroElectroMechanical System (MEMS) devices include microphones and speakers to mention two examples. In the case of a MEMS microphone, sound energy enters through a sound port and vibrates a diaphragm and this action creates a corresponding change in electrical potential (voltage) between the diaphragm and a back plate disposed near the diaphragm. This voltage represents the sound energy that has been received. Typically, the voltage is then transmitted to an electric circuit (e.g., an integrated circuit such as an application specific integrated circuit (ASIC)). Further processing of the signal may be performed on the electrical circuit. For instance, amplification or filtering functions may be performed on the voltage signal at the integrated circuit.

The components of the microphone are typically disposed on a printed circuit board (PCB), which also may provide electrical connections between the microphone components as well as providing a physical support for these components. The integrated circuit typically is of a significant size such that the overall dimensions of the MEMS device depend at least somewhat upon the size of the integrated circuit.

In many applications, the size of the MEMS device is desired to be as small as possible and the above-mentioned layout of these devices has caused problems in reducing the size of devices. For example, if the MEMS device is deployed in a cellular phone or external headset it is often desirable to have the device be as small as possible. Since the integrated circuit was always deployed on the circuit board, the overall size of the device could only be reduced so far.

Because of these shortcomings, previous approaches have not adequately addressed the above-mentioned problems and user dissatisfaction with these previous approaches has increased.

BRIEF DESCRIPTION OF THE DRAWINGS

For a more complete understanding of the disclosure, reference should be made to the following detailed description and accompanying drawings wherein.

Figure 1:
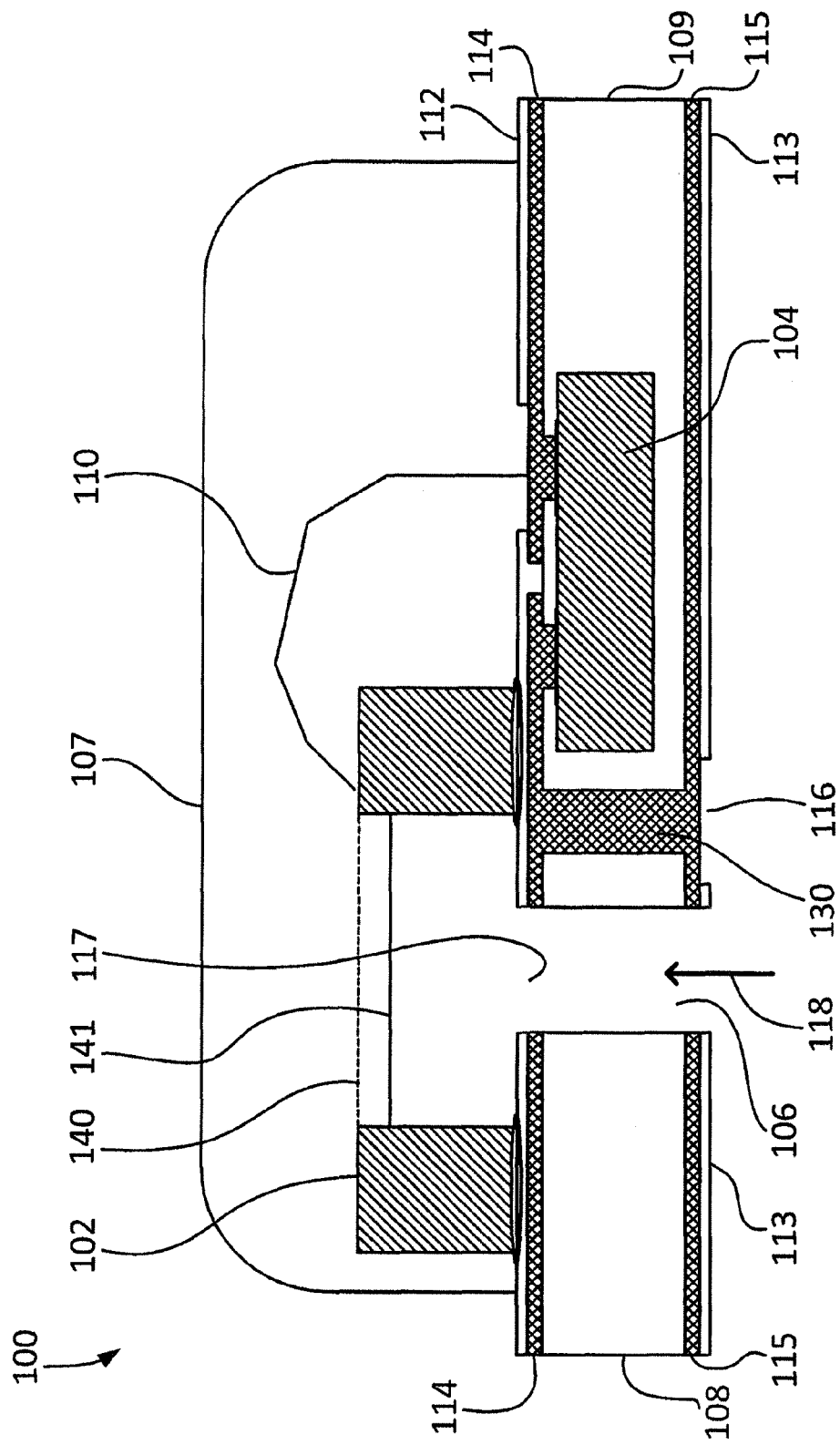
FIG. 1 is a block diagram of a MEMS device according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not necessarily required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided where an integrated circuit (e.g., an ASIC or similar device) or other electrical circuit component is embedded in the printed circuit board (PCB) of an acoustic device or assembly (e.g., a MEMS microphone). As used herein, the integrated circuit is an electronic device that may be enclosed in its own separate housing and performs separate processing functions on an incoming electrical signal where the processing functions are more than merely passing the signal. In other words, the integrated circuit is more than just a transmission medium.

In some of these embodiments, the output signals of the embedded integrated circuit (e.g., the ASIC) are routed directly into plated through hole vias in the PCB to an outer layer of metallization to customer solder pads (e.g., at the "bottom side" of the PCB). Additionally, the signals between the ASIC and MEMS die are routed directly into plated through hole vias in the PCB to the outer layer metallization opposite the customer solder pads (e.g., at the "top side" of the PCB). This outer metallization layer ("top layer") may be used for final microphone assembly. In some aspects, the MEMS die is mounted to the top side of the PCB (e.g., either by flip-chip bonding or die attach and wire bonding) and a lid is adhered (e.g., via solder, epoxy or some other approach) to the top side of the PCB to acoustically seal and protect the MEMS device (e.g., a MEMS microphone) from the environment and allow for further assembly at a customer. In other aspects, an interface layer (e.g., a redistribution layer) may be used or disposed at the integrated circuit and this interface layer may be disposed/embedded between the contact pads (of the integrated circuit) and the base (e.g., a printed circuit board).

In one advantage of the present approaches, considerable space is saved allowing the overall device to be reduced in size. The MEMS die is attached in some examples at least partially over the integrated circuit (e.g., either flip chip or wire bond with die attached) in order to save this space. In other examples, the MEMS die is disposed completely over the embedded integrated circuit (i.e., it completely covers the embedded integrated circuit). The acoustic port is disposed through the base of the PCB (i.e., through the bottom of the PCB) or through the lid (i.e., through the cover at the top of the device). An acoustic seal may be placed by the customer on the same side as the acoustic port of the acoustic device or assembly. In other aspects, a double acoustic port is used to gasket to a customer's application to increase back volume of the device and thereby improve device performance.

Since the components of the acoustic device or assembly (e.g., the MEMS die and the integrated circuit) are in some aspects physically stacked over each other, the device can be of smaller dimensions. In one example, an approximate 30 percent saving is achieved as compared to previous approaches. It will be appreciated that the integrated circuit merely occupies space that normally is unused. In so doing, a more efficient disposition of components is achieved.

In many of these embodiments, a Microelectromechanical System (MEMS) microphone includes a printed circuit board, a MEMS die, and an integrated circuit. The MEMS die is disposed on a top surface of the printed circuit board. The integrated circuit is disposed at least partially within the printed circuit board and produces at least one output signal. The output signals of the integrated circuit are routed directly into at least one conductor to access pads at the printed circuit board and the access pads are disposed on a bottom surface of the printed circuit board that is opposite the top surface.

In some aspects, at least one conductor comprises plated through hole vias and an outer layer of metallization on the printed circuit board. In other aspects, the MEMS die is mounted to the top surface of the PCB and a lid is adhered to the top surface of the PCB to acoustically seal and protect the MEMS device from external environmental elements. In some examples, a port extends through the lid and in other examples a port extends through the printed circuit board. In other aspects, a back volume is disposed between the printed circuit board and the MEMS die.

In some examples, the integrated circuit is disposed partially under the MEMS die. In other examples, the integrated circuit is disposed completely under the MEMS die.

In some aspects, the integrated circuit is an application specific integrated circuit (ASIC). In other aspects, the integrated circuit includes conductive pads and an interface layer is disposed between the conductive pads of the integrated circuit and the printed circuit board. In some aspects, the interface layer is an insulating layer.

Referring now to FIG. 1, one example of an acoustic device or assembly 100 with an embedded integrated circuit is described. The device 100 includes a printed circuit board 108, a cover or lid 107, a MEMS die 102 that includes a back plate 140 and a diaphragm 141, an integrated circuit 104, a connection area 116, and an acoustic port 106 through which sound 118 enters into a front volume 117. As the sound (indicated by the arrow labeled 118) enters the front volume 117, the diaphragm of MEMS die 102 vibrates changing the distance between the diaphragm 141 and back plate 140. This causes a voltage to be produced at the back plate 140, which is transmitted to the integrated circuit 104 via a conductor 110. The integrated circuit 104 performs processing on the signal and then the signal is transmitted to the connection area 116. A customer or other user can access the signal at the area 116 for further processing. In one example, the device or assembly 100 is deployed in a cellular phone such that the area 116 electrically couples to electronic components of the cellular phone. Other examples of customer or end-user devices (e.g., computers or headsets) are possible.

The MEMS die 102, back plate, and diaphragm are components known to those skilled in the art that are typically used on MEMS devices and will not be described further herein. The integrated circuit 104 is any circuit that performs any type of function (e.g., amplification). The integrated circuit 104 may be of any shape or configuration.

It will be appreciated that although a microphone is shown and described, other examples of MEMS devices can also be used according to the approaches described herein. It will also be appreciated that the disposition of the integrated circuit 104 is shown as being at least partially under the MEMS die 102. However, it will be appreciated that the integrated circuit 104 can be entirely under or not at all under the MEMS die 102. Additionally, although the integrated circuit 104 is shown as being rectangular it will also be understood that the integrated circuit 104 may assume any shape or appropriate dimensions. It will also be understood that multiple integrated circuits and or passive devices may be embedded into the base PCB.

The PCB 108 includes solder mask layers 112 and 113, metal layers 114 and 115, vias 130 filled or plated with a conductive metal, and an inner PCB layer 109 (e.g., constructed of woven glass epoxy composite material, such as FR-4 laminate material or BT epoxy). A wire or other conductor 110 couples the MEMS die 102 to the integrated circuit 104 via the first metal layer 114. The output of the integrated circuit 104 is electrically coupled to the area 116 via the first metal layer 114, the vias 130, and the second metal layer 115. It will be appreciated that various fabrication approaches can be used to construct the device 100 and the PCB 108. It will also be understood that other layers, configurations, dimensions, and construction materials are possible. In other aspects, an interface layer (e.g., a redistribution layer) may be used or disposed at the integrated circuit 104 and this interface layer may be disposed/embedded between the contact pads (of the integrated circuit) and the first metal layer of the PCB 108.

FIGS. 2A, 2B, 3A, 3B, and 4 are examples of acoustic devices or assemblies (e.g., MEMS microphones) that include embedded integrated circuits. As with the example of FIG. 1, it will be appreciated that although a microphone is shown, other examples of MEMS devices can also be used according to the approaches described herein. It will also be appreciated that the disposition of the integrated circuit is shown as being at least partially under the MEMS die. However, it will be appreciated that the integrated circuit can be entirely under or not at all under the MEMS die. Although the integrated circuit is shown as being rectangular it will also be understood that the integrated circuit may assume any shape or appropriate dimensions.

Figure 2A:
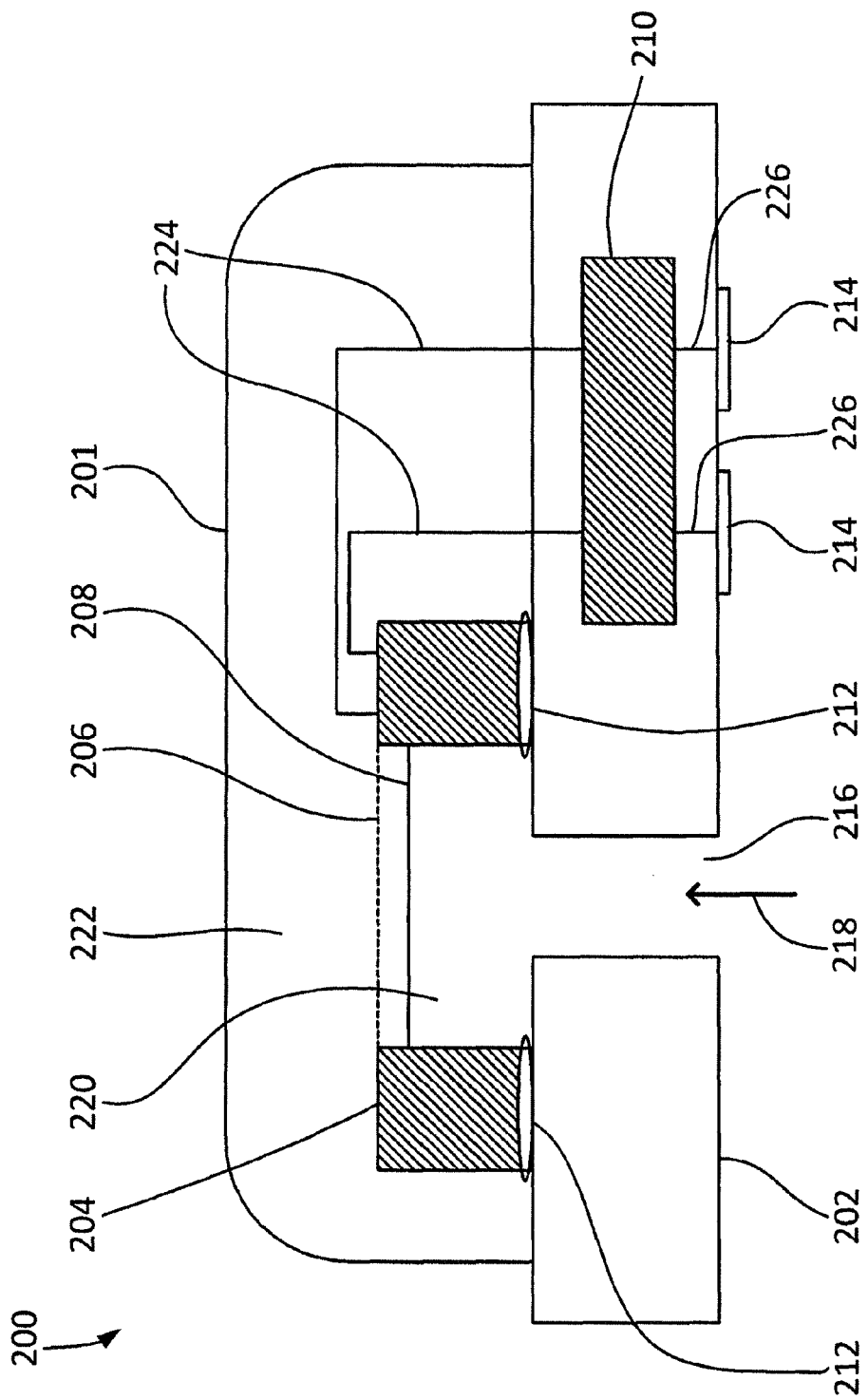
FIGS. 2A and 2B are block diagrams of MEMS devices with the MEMS die within these devices arranged in a first orientation according to various embodiments of the present invention.

Referring now to FIG. 2A, one example of an acoustic device or assembly 200 (e.g., a MEMS microphone) with an embedded integrated circuit is described. The device 200 includes a printed circuit board 202, a cover 201, a MEMS die 204 (that includes a back plate 206 and a diaphragm 208), an integrated circuit 210, acoustic seal 212, connection pads 214, and an acoustic port 216 through which sound 218 enters into a front volume 220. A back volume 222 is also provided. As the sound (indicated by the arrow labeled 218) enters the front volume 220, the diaphragm 208 vibrates changing the distance between the diaphragm 208 and back plate 206. This causes a voltage to be produced at the back plate 206, which is transmitted to the integrated circuit 210 via conductors 224. The integrated circuit 210 performs processing on the signal and transmits it to pads 214 via conductors 226. The pads 214 may be a conductive area where the electronics of a customer application (e.g., a cellular phone or computer) may be coupled. A customer can access the voltage at the pads 214 for further signal transmission or usage.

The printed circuit board 202 is any type of printed circuit board that is dimensioned to hold the integrated circuit 210. For example, the PCB may have solder mask layers, and metallization layers as described above with respect to FIG. 1.

The MEMS die 204, back plate 206, and diaphragm 208 are components known to those skilled in the art that are typically used on MEMS devices and will not be described further herein. The integrated circuit 210 is any circuit that performs any type of function (e.g., amplification). The integrated circuit 210 may be of any shape or configuration. The acoustic seals 212 provide an acoustic seal between the front volume 220 and the back volume 222 as known to those skilled in the art. The conductors 224 and 226 are constructed of any type of conducting material to provide an electrical connection. In one example, the conductors 224 are wire bonds and 226 are vias that include a metal (e.g., copper) to provide for the electrical connection. In other aspects, an interface layer (e.g., a redistribution layer) may be used or disposed at the integrated circuit 210 and this interface layer may be disposed/embedded between the contact pads (of the integrated circuit) and the first metal layer of the PCB 202.

Figure 2B:
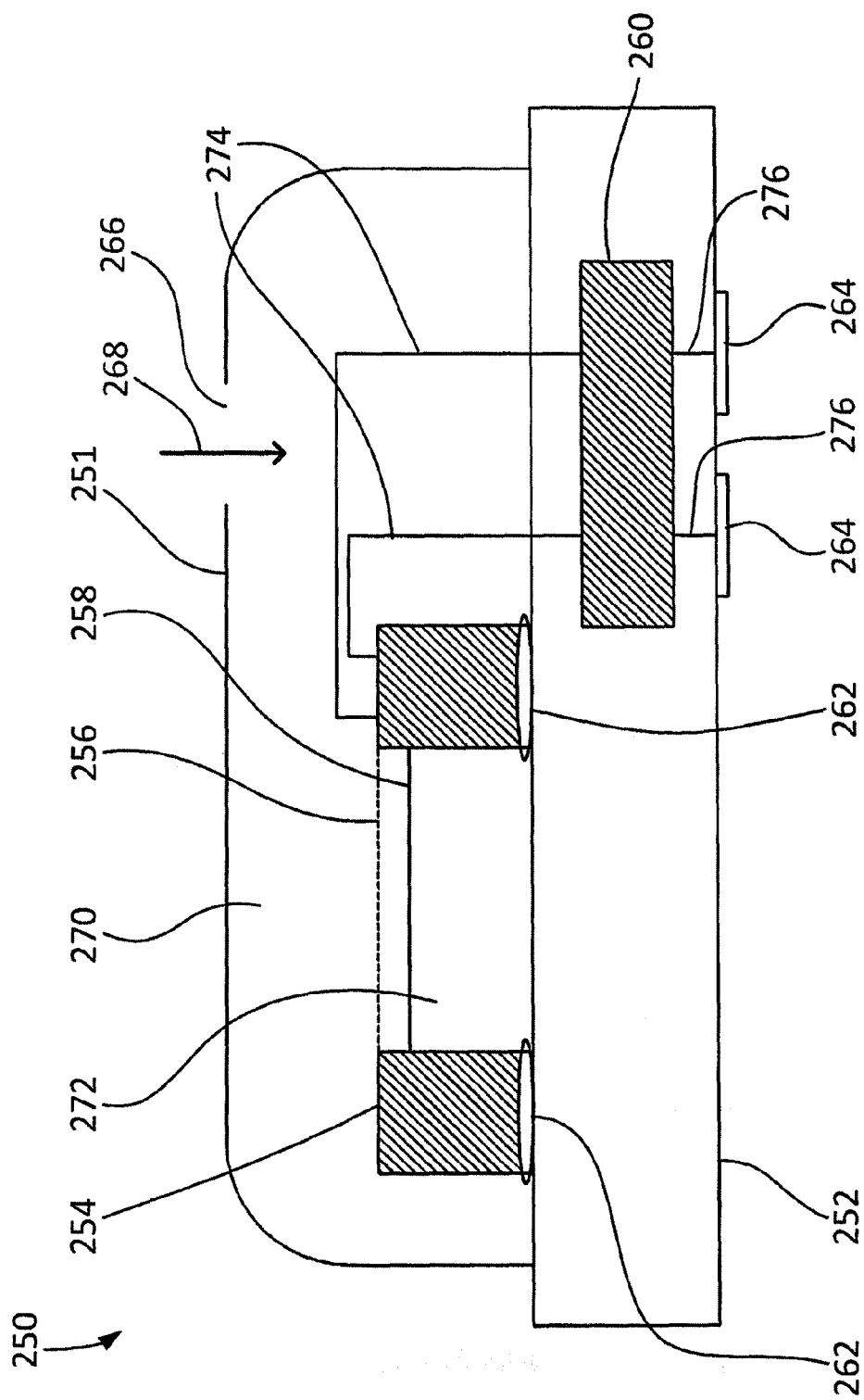

Referring now to FIG. 2B, another example of an acoustic device or assembly 250 (e.g., a MEMS microphone) within an embedded electrical circuit is described. The example of FIG. 2B is similar to the example of FIG. 2A except that the bottom port of FIG. 2A is now replaced with a top port and sound enters through the top of the device 250.

More specifically, the device 250 includes a printed circuit board 252, a cover 251, a MEMS die 254 (that includes a back plate 256 and a diaphragm 258), an integrated circuit 260, acoustic seal 262, connection pads 264, and a top acoustic port 266 through which sound 268 enters into a front volume 270. A back volume 272 is also provided. As the sound 268 enters the front volume 270, the diaphragm 258 vibrates changing the distance between the diaphragm 258 and back plate 256. This causes a voltage to be produced at the back plate 256, which is transmitted to the integrated circuit 260 via conductors 274. The integrated circuit 260 performs processing on the signal and transmits it to pads 264 via conductors 276. A customer or user can access the voltage at the pads 264 for further processing. The components operate in a manner similar to those of FIG. 2A and their operation will not be described further. The disposition of the integrated circuit within the PCB 252 is also similar to that described above with respect to FIG. 2A and this will not be described further. In other aspects, an interface layer (e.g., a redistribution layer) may be used or disposed at the integrated circuit 210 and this interface layer may be disposed/embedded between the contact pads (of the integrated circuit) and the first metal layer of the PCB 252.

Figure 3A:
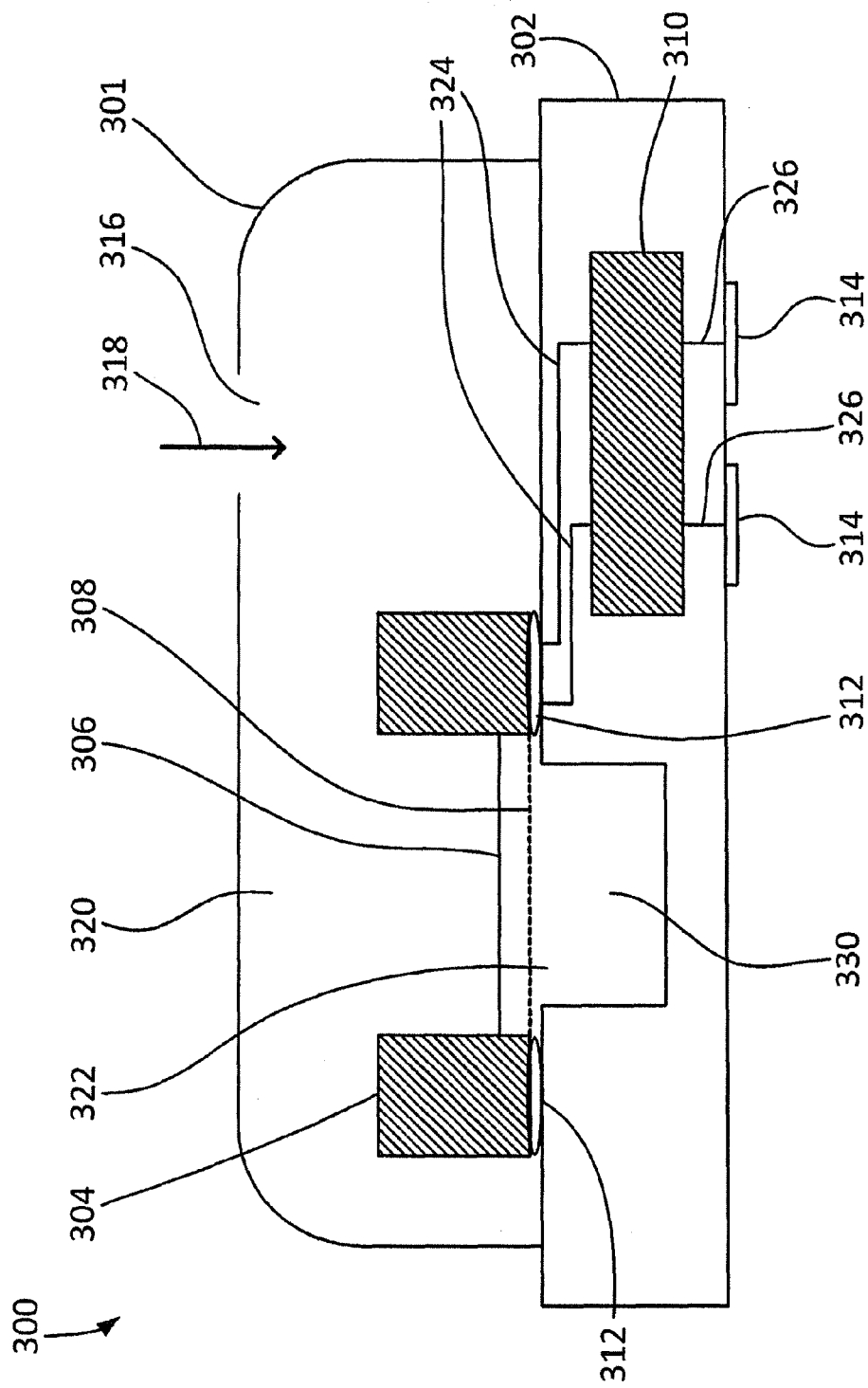
FIGS. 3A and 3B are block diagrams of MEMS devices with the MEMS die within these devices arranged in a second orientation according to various embodiments of the present invention.

Referring now to FIG. 3A, one example of an acoustic device or assembly 300 (e.g., a MEMS microphone) with an embedded integrated circuit is described. The device or assembly 300 includes a printed circuit board 302, a cover 301, a MEMS die 304 that includes a back plate 308 and a diaphragm 306, an integrated circuit 310, acoustic seal 312, connection pads 314, and a top acoustic port 316 through which sound 318 enters into a front volume 320. A back volume 322 extends between the MEMS die 304 and the PCB 302. A cavity 330 extends through the PCB 302. In some aspects, a customer application board with another cavity may couple to the PCB 302 to provide a further increased back volume. The increased back volume provides improved performance for the device 300. It will be appreciated that the dimensions, shapes, and other configuration characteristics for the cavities that comprise the increased back volume may vary to suit the performance needs of the system.

As the sound 318 enters the front volume 320, the diaphragm 306 vibrates changing the distance between the diaphragm 306 and back plate 308. This causes a voltage to be produced at the back plate 308, which is transmitted to the integrated circuit 310 via conductors 324. The integrated circuit 310 performs processing on the signal and transmits it to pads 314 via conductors 326. The pads 314 may be conductive areas to which a customer or user may couple application specific electronics (e.g., from a cellular phone or computer). A customer or user can access the voltage at the pads 314 for further processing.

The printed circuit board 302 is any type of printed circuit board that is dimensioned to hold the integrated circuit 310. One example of a PCB is described above with respect to FIG. 1.

The MEMS die 304, back plate 308, and diaphragm 306 are components known to those skilled in the art that are typically used on MEMS devices and will not be described further herein. The integrated circuit 310 is any circuit that performs any type of function (e.g., amplification). The integrated circuit 310 may be of any shape or configuration. The acoustic seal 312 provide an acoustic seal between the front volume 320 and the back volume 322 as known to those skilled in the art. The conductors 324 and 326 are constructed of any type of conducting material to provide an electrical connection. In one example, the conductors 324 and 326 are vias that include a metal (e.g., copper) to provide for the electrical connection. In other aspects, an interface layer (e.g., a redistribution layer) may be used or disposed at the integrated circuit 310 and this interface layer may be disposed/embedded between the contact pads (of the integrated circuit) and the first metal layer of the PCB 302.

Figure 3B:
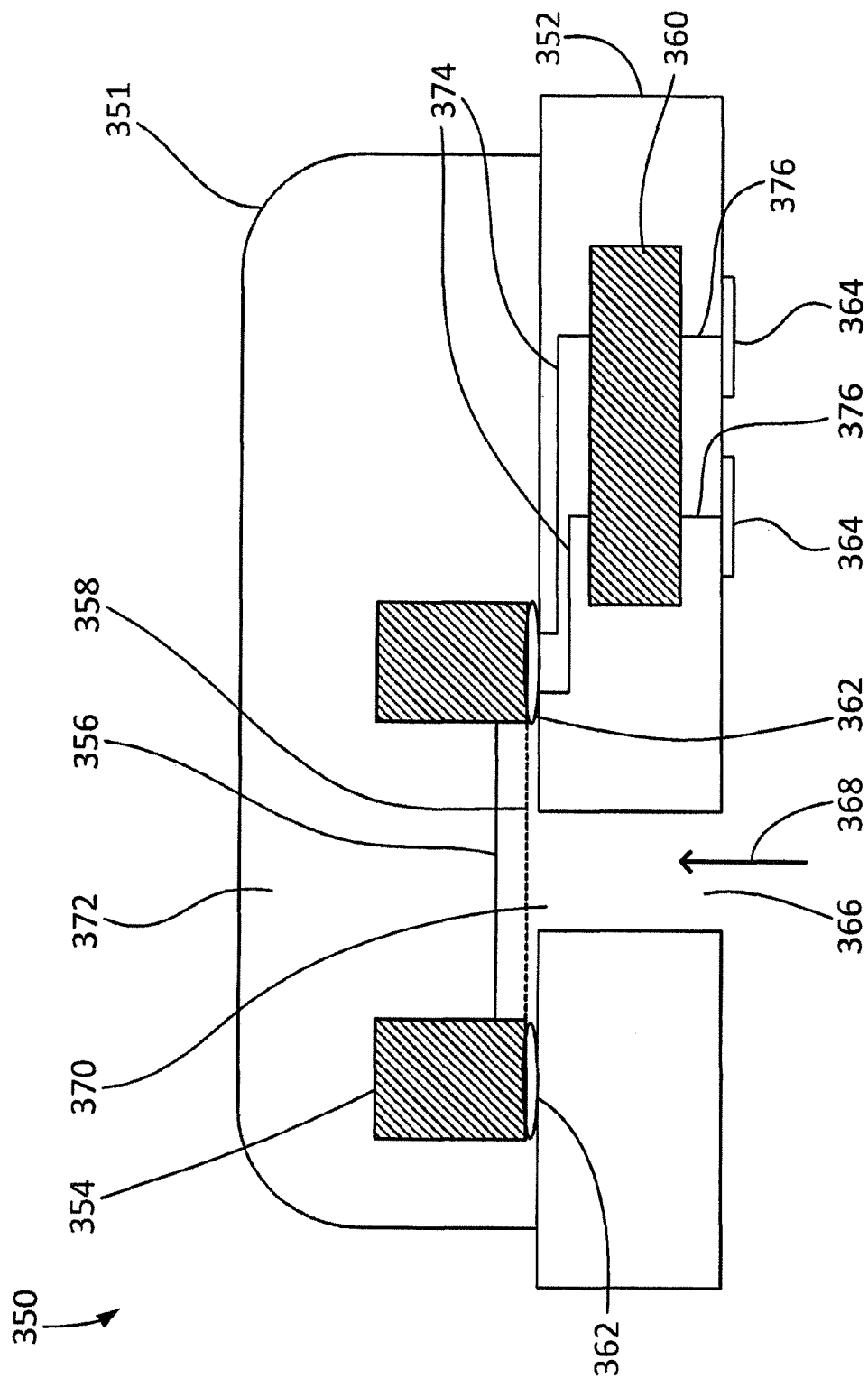

Referring now to FIG. 3B, another example of an acoustic device or assembly 350 (e.g., a MEMS microphone) within an embedded electrical circuit is described. The example of FIG. 3B is similar to the example of FIG. 3A except that the top port of FIG. 3A is now replaced with a bottom port and sound enters through the bottom of the device.

More specifically, the device 350 includes a printed circuit board 352, a cover 351, a MEMS die 354 that includes a back plate 358 and a diaphragm 356, an integrated circuit 360, acoustic seal 362, connection pads 364, and a bottom acoustic port 366 through which sound 368 enters into a front volume 370. A back volume 372 is also provided. As the sound 368 enters the front volume 370, the diaphragm 356 vibrates changing the distance between the diaphragm 356 and back plate 358. This causes a voltage to be produced at the back plate 358, which is transmitted to the integrated circuit 360 via conductors. The integrated circuit 360 performs processing on the signal and transmits it to pads 364 via conductors 376. A customer can access the voltage at the pads 364 for further processing. The components of the system of FIG. 3B operate in a manner similar to those of FIG. 3A and their operation will not be described further herein. In other aspects, an interface layer (e.g., a redistribution layer) may be used or disposed at the integrated circuit 310 and this interface layer may be disposed/embedded between the contact pads (of the integrated circuit) and the first metal layer of the PCB 352.

In other aspects, the integrated circuits used herein can take a variety of different forms and structures. For example, in one aspect the integrated circuit (e.g., an ASIC) has active electrical circuitry (e.g., resistors or capacitors) and/or electrical connections on only one side. This disposition makes the integrated circuit less expensive than integrated circuits that have active circuitry and/or electrical connections on both sides. In other aspects, the base PCB may also have embedded chip capacitors or resistors to improve acoustical or electrical (e.g., RF immunity) performance.

In other aspects, the integrated circuit has no open holes or openings in or through it. Having no holes extending through the integrated circuit is advantageous because silicon is typically expensive and, in many circumstances, it is preferable that any acoustic holes (e.g., ports) be made through the printed circuit board (PCB) only and not through the integrated circuit.

Figure 4:
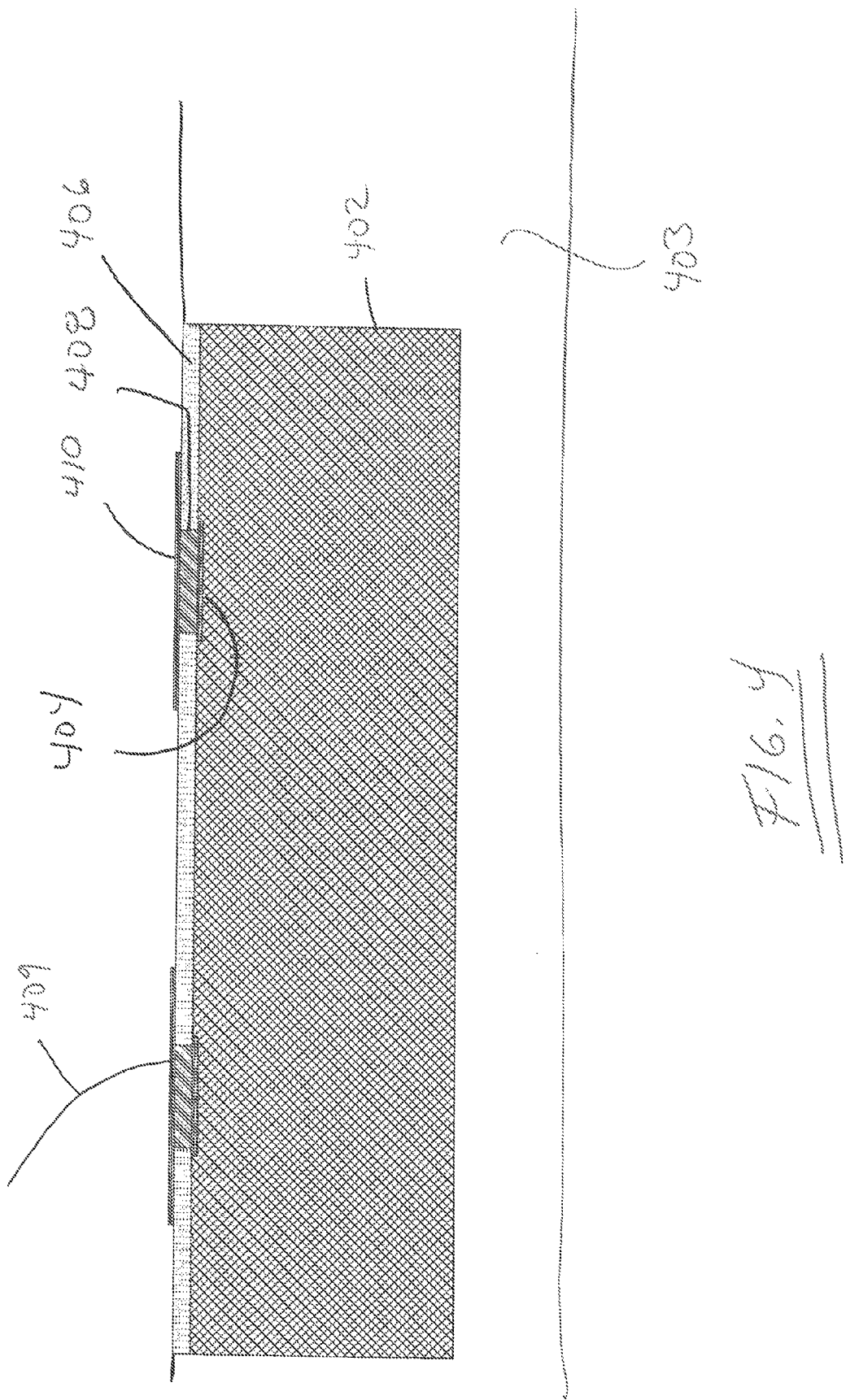
FIG. 4 is a cross sectional diagram of a portion of a MEMS device or assembly showing a close-up view of an embedded integrated circuit according to various embodiments of the present invention.

In the example acoustic assemblies described herein, an interface layer (e.g., a redistribution layer) may be used or disposed at the integrated circuit and this interface layer may be disposed/embedded between the contact pads (of the integrated circuit) and the base (e.g., a printed circuit board). Referring now to FIG. 4, one example of such an arrangement is described. It will be understood that this arrangement—shown in detail in FIG. 4—can be applied to any of the other examples presented herein. An integrated circuit 402 includes conductive pads 404 and is disposed in a base (e.g., a PCB) 403. The pads 404 are in one aspect metal pads and may be constructed of aluminum. Other examples of conductive materials may also be used. An insulating layer 406 (a part of the integrated circuit 402) is disposed over and across the integrated circuit 402. Electrically conductive vias 408 extend through the insulating layer 406. Conductive redistribution pads 410 (e.g., constructed from copper) are disposed on the insulating layer 406 and are coupled to the vias 408. A laser drilled via (not shown in FIG. 4) that is plated with copper couples the first layer of the PCB to the RDL pad.

In one particular example, the integrated circuit 402 is an ASIC that includes the RDL-Cu pads 410 and aluminum pads 404. The insulating layer 406 provides an interface from pads 404 on the ASIC 402 to the base 403 (e.g., a PCB) in which the ASIC 402 is embedded. The insulating layer 406 has openings to the aluminum pads 404. In one aspect, the copper pads 410 are larger (e.g., having a large surface area or cross-sectional area) than the aluminum pads 404. The aluminum pads 404 and copper RDL pads 410 are connected by using the vias/holes 408 through the insulating layer 406.

The RDL pads 410 on top of the ASIC 402 provide an advantageous interface between the integrated circuit 402 and the base 403 (e.g., a PCB). In this respect, PCB processing generally uses copper plating. Good adhesion and/or a good interface/bond occur when, for example, the PCB copper via is directly contacted to another copper layer (i.e., copper RDL pad 410). In other words, after the ASIC is embedded into the PCB material, a hole is laser drilled such that an opening is produced to the copper pad on the RDL layer. The PCB board with the embedded ASIC and laser drilled holes is then placed in a copper plating bath so as to plate the walls of the laser drilled hole. This provides a physically secure and electrically sufficient bond between the electrically circuitry of the PCB, the copper RDL pads and the bond pads on the ASIC.

In other aspects, the integrated circuit 402 is completely laminated into the base/PCB with no intentional air voids around the integrated circuit 402. By "laminating," it is meant that materials (such as epoxy laminate, copper and adhesive) are layered and placed in a press using temperature, pressure and potentially in a vacuum environment. This gives the package better mechanical stability and likely better reliability performance than a package that has space/voids around the integrated circuit 402.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A Microelectromechanical System (MEMS) microphone, comprising:
   a printed circuit board, the printed circuit board having a first metal layer, a second metal layer, and at least one plated through hole via, the first metal layer and the second metal layer electrically coupled to opposing end portions of the at least one plated through hole via;
   a MEMS die disposed on a top surface of the printed circuit board;
   an integrated circuit having a surface facing the first metal layer, the integrated circuit disposed within the printed circuit board and between the first metal layer and the second metal layer, the integrated circuit producing at least one output signal; and
   such that the at least one output signal of the integrated circuit is routed directly from the top surface of the integrated circuit to the first metal layer of the printed circuit board, to the at least one plated through hole via, to the second metal layer, and then to access pads at the printed circuit board, the access pads being disposed on a bottom surface of the printed circuit board that is opposite the top surface and being electrically coupled to the second metal layer.

2. The MEMS microphone of claim 1 wherein the MEMS die is mounted to the top surface of the PCB and a lid is adhered to the top surface of the PCB to acoustically seal and protect the MEMS device from external environmental elements.

3. The MEMS microphone of claim 2 wherein a port extends through the lid.

4. The MEMS microphone of claim 1 wherein a port extends through the printed circuit board.

5. The MEMS microphone of claim 1 wherein a back volume is disposed between the printed circuit board and the MEMS die.

6. The MEMS microphone of claim 1 wherein the integrated circuit is disposed partially under the MEMS die.

7. The MEMS microphone of claim 1 wherein the integrated circuit is disposed completely under the MEMS die.

8. The MEMS microphone of claim 1 wherein the integrated circuit is an application specific integrated circuit (ASIC).

9. The MEMS microphone of claim 1 wherein the integrated circuit includes conductive pads and an interface layer is disposed between the conductive pads of the integrated circuit and the printed circuit board.

10. The MEMS microphone of claim 9 wherein the interface layer comprises an insulating layer.

* * * * *